(12) United States Patent
Moser et al.

(10) Patent No.: US 8,273,159 B2
(45) Date of Patent: Sep. 25, 2012

(54) CONTROL DEVICE MODULE, ESPECIALLY IN OR FOR A MOTOR VEHICLE

(75) Inventors: Manfred Moser, Reutlingen (DE); Hartmut Wayand, Pfullingen (DE)

(73) Assignee: Robert Bosch GmbH, Stuttgart (DE)

( * ) Notice: Subject to any disclaimer, the term of this patent is extended or adjusted under 35 U.S.C. 154(b) by 933 days.

(21) Appl. No.: 12/085,749

(22) PCT Filed: Dec. 27, 2006

(86) PCT No.: PCT/EP2006/070224
§ 371 (c)(1),
(2), (4) Date: Jan. 5, 2009

(87) PCT Pub. No.: WO2007/074158
PCT Pub. Date: Jul. 5, 2007

(65) Prior Publication Data
US 2009/0171515 A1    Jul. 2, 2009

(51) Int. Cl.
*B01D 53/22* (2006.01)
*H05K 5/06* (2006.01)

(52) U.S. Cl. ............ 96/4; 96/6; 95/45; 95/46; 55/385.3; 55/385.4; 55/385.6; 701/1; 200/83 R; 200/83 A; 200/83 F; 200/302.1; 200/306; 220/373

(58) Field of Classification Search ............... 701/1, 36; 96/4, 6; 95/45, 46; 55/385.1, 385.2, 385.3, 55/385.4, 385.6; 200/83 R, 83 A, 83 F, 83 N, 200/83 P, 302.1, 306; 220/373
See application file for complete search history.

(56) References Cited

U.S. PATENT DOCUMENTS

| 4,636,598 | A |   | 1/1987  | Suzuki |
|-----------|---|---|---------|--------|
| 4,800,244 | A | * | 1/1989  | Suzuki ........................ 200/306 |
| 5,308,939 | A | * | 5/1994  | Sasaki ........................ 200/83 R |
| 5,422,791 | A | * | 6/1995  | Bentz et al. ................. 200/83 N |
| 5,461,208 | A | * | 10/1995 | McKenna .................. 200/302.1 |
| 6,095,568 | A |   | 8/2000  | Fendt et al. |

FOREIGN PATENT DOCUMENTS

| DE | 8408092 |    | 6/1984 |
| DE | 36 35 165 |  | 4/1988 |
| DE | 36 35 165 | A1 * | 4/1988 |
| DE | 41 40 487 | | 6/1993 |
| DE | 42 10 979 | | 10/1993 |
| DE | 34 37 901 | | 9/1995 |
| DE | 197 08 116 | | 9/1998 |
| DE | 198 07 215 | | 8/1999 |
| DE | 299 23 501 | | 12/2000 |
| EP | 0 268 742 | | 6/1988 |
| JP | 7-501651 | | 2/1995 |
| JP | 2005-129861 | | 5/2005 |
| WO | WO 93/11586 | | 6/1993 |

* cited by examiner

*Primary Examiner* — Jason M Greene
(74) *Attorney, Agent, or Firm* — Kenyon & Kenyon LLP

(57) ABSTRACT

A control device module for a motor vehicle includes a control device that has a closed housing in which a first internal pressure prevails, and at least one connecting device for coupling a connecting element of an electrical cable. A closed space is defined in the coupled state between the connecting device and the connecting element, in which closed space a second internal pressure prevails. The control device also includes a pressure compensating device for adapting the first and second internal pressures to an external pressure that acts on the control device module from outside.

20 Claims, 3 Drawing Sheets

(A-A)

CONTROL DEVICE MODULE, ESPECIALLY IN OR FOR A MOTOR VEHICLE

BACKGROUND OF THE INVENTION

1. Field of the Invention

The present invention relates to a control device module for a motor vehicle.

2. Description of Related Art

Control device modules are modules that perform control functions. Control device modules are generally known in a large number of different embodiments and variants. One example of such a control device module is described in published German patent document DE 198 07 215. Although in principle it is capable of being applied to arbitrary control device modules, in the following the present invention, as well as the problematic on which is based, is explained with reference to control devices in the area of motor vehicles, in particular with reference to engine control devices.

Control device modules typically have an electrical control device that is situated in a housing, as well as a plug connector having contact pins via which the control device is capable of being coupled to a cable harness of the vehicle. The electrical components inside the housing of the control device, as well as the contact pins of the plug connector, must be protected from particles, and in particular moisture, from the engine compartment, in order to prevent damage due for example to a short-circuit. For this purpose, the housing of the control device and the plug connector should be fashioned so as to be proof in the coupled state against solid materials, liquids, and gases from the engine compartment; this is typically achieved using seals. However, this tight sealing can be ensured only up to a predetermined pressure difference between an internal pressure in the control device module and an external pressure prevailing in the engine compartment. If the pressure difference exceeds the predetermined value, e.g. as a result of a heating of the air inside the control device, the seals will deform in such a way that an exchange of material takes place between the control device module and the engine compartment. This exchange of material is to be avoided.

A first, generally known, approach to the problem described above provides ventilation of the control device and of the plug connector via the coupled cable harness. Here, the cable harness has gas-conducting strands that are connected at one side to an air volume outside the engine compartment and at the other side to the plug connector of the control device module. The plug connector itself is in turn connected to the internal compartment of the control device via a duct. If, for example, air is collected inside the control device in order to cool it, air can be guided into the interior of the control device from outside the engine compartment through the strand in the cable harness, through the plug connector, and through the duct, until the internal pressure in the housing again corresponds essentially to the external pressure in the engine compartment.

A problem with this first approach is that an adequate ventilation of the control device module depends on the cable harness with the gas-conducting strands. If the cable harness is for example incorrectly installed, this can result in poor ventilation and thus in damage to the control device module.

In a second generally known approach to the above-described problem, a special pressure compensating device is provided for the ventilation of the control device in the control device module. For this purpose, the interior of the housing of the control device is connected to the pressure compensating element by a pressure-conducting duct. The pressure compensating element is typically fashioned as a gas-conducting membrane that is impermeable to solid materials and to liquids. As a consequence, in this second approach the ventilation is carried out via the gases in the engine compartment, which are however filtered through the membrane.

However, this second approach has the problem that the plug connector with the coupled cable harness plug is not ventilated. As a result, in the second approach cable harness plugs must be used that provide a sealing of each contact pin of the plug connector in order to ensure that no gas volume is present in the space between the plug connector and the cable harness plug. The presence of an expanding and contracting gas volume would result in penetration of materials from the engine compartment, in particular moisture. Such cable harness plugs and plug connectors are very expensive to manufacture, and often provide only a partial sealing, particularly after frequent coupling and decoupling of the cable harness plug.

A BRIEF SUMMARY OF THE INVENTION

The control device module according to the present invention has the advantage that it provides ventilation both of a control device and also of a connecting device that couples a connecting element of an electrical cable. In this way, a reliable functioning of the control device module can be ensured over a long period of time. In addition, these advantages are achieved in a simple manner.

The control device module according to the present invention includes the control device, at least the one connecting device, and a pressure compensating device. The control device is situated in a closed housing in which a first internal pressure prevails. In the coupled state of the connecting element, a closed space is defined between the connecting device and the connecting element, and a second internal pressure prevails in this closed space. The pressure compensating device is used to adapt the first and second internal pressures to an external pressure that acts on the control device module from the outside.

The idea that forms the basis of the present invention is that an adapting of the first internal pressure in the control device and of the second internal pressure in the closed space to an external pressure that acts on the control device from outside is achieved using only one pressure compensating device. For this purpose, the connecting device and the housing of the control device are both coupled to the pressure compensating device. A pressure compensation for the connecting device can thus be achieved without an additional pressure compensating device. Only a coupling of the connecting device to the pressure compensating element is required.

In addition, in this solution ventilation via the cable harness is not required. This makes possible a simpler design of the cable harness and a more reliable ventilation of the control device module.

In an example embodiment of the present invention, the pressure compensating element has a membrane. Adaptation of the first and second internal pressures to the external pressure takes place via this membrane. The membrane is preferably impermeable to liquids and/or permeable to gases.

In this way, the expansion and/or compression of gases inside the control device module can take place via the membrane in an unhindered fashion. However, it is ensured that no liquids can penetrate into the control device and/or into the connecting device. In this way, a reliable functioning of the control device module over a long period of time is achieved. In a particularly advantageous realization of the present invention, the membrane is made of Gore-Tex material. Such a microporous membrane conducts liquid vapors inside the control device module to the outside and does not permit liquids to penetrate into the control device module.

The present invention also provides that the housing and/or the connecting device are each connected to the pressure compensating device via a pressure-conducting element. This feature preferably permits the first and second internal pressures to be conducted to the pressure compensating device, thus permitting adaptation of the first and second internal pressures to the external pressure.

In an example embodiment, the pressure-conducting element is fashioned as a gas-conducting duct. When the gases contained in the housing and/or in the connecting device expand, they are conducted to the pressure compensating device via the gas-conducting ducts. When the gases inside the housing and/or inside the connecting device contract, gases from outside the control device module are conducted into the housing and/or into the connecting device through the membrane and through the gas-conducting ducts.

In addition, the pressure-conducting element may have a sealing element that prevents penetration of liquids and/or particles into the control device and/or into the connecting device. Thus, penetration of dust or moisture is prevented for example during repair work in which the electrical cable is disconnected from the control device module and is later reconnected. Such a sealing element prevents particles and/or liquids from penetrating into the control device from the connecting device through the gas-conducting element. In a specific embodiment of the present invention, the sealing element is fashioned as a labyrinth seal. This enables an economical and reliable sealing of the pressure-conducting element against liquids and/or particles.

In an example embodiment of the present invention, the housing and the connecting device are situated together on a bearer component that has the pressure compensating device and/or the pressure conducting element. Such a spatially narrow situation of the bearer and of the pressure compensating device and/or of the pressure-conducting element can result in improved use of available space.

The connecting element may have a plug and/or a socket for coupling a cable harness. Since the control device module is typically used in motor vehicles, which standardly have a cable harness, an interface fashioned in this manner facilitates installation and removal of the control device module.

A BRIEF DESCRIPTION OF THE SEVERAL VIEWS OF THE DRAWING

DETAILED DESCRIPTION OF THE INVENTION

Figure 1:
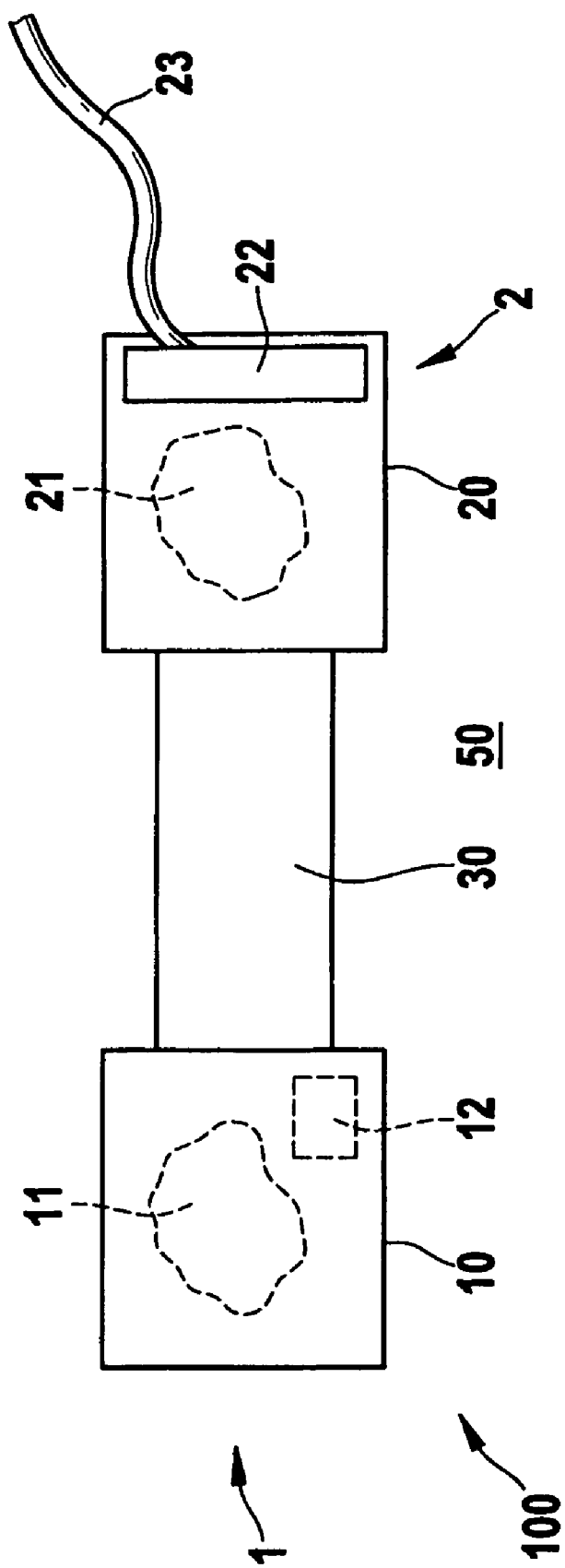
FIG. 1 shows a top view of a general design of a control device module according to the present invention.

In all Figures of the drawings, identical or functionally identical elements have been provided with identical reference characters, unless otherwise indicated.

FIG. 1 shows a top view of a general design of the control device module according to the present invention. A control device 1 has electronic components 12 and a closed housing 10. Here, "closed" refers to a material-tight sealing of the housing against substances, e.g. gases, liquids, or particulate dust in the engine compartment. A first internal pressure 11 prevails in the closed housing. In addition, a connecting device 2 is provided for coupling a connecting element 22 of an electrical cable 23. In the coupled state of connecting element 22, connecting device 2 with connecting element 22 defines a closed space 20A. The term "closed" is to be understood as defined above. A second internal pressure 21 prevails in the closed space. In addition, a pressure compensating device 30 is provided for adapting first and second internal pressures 11, 21 to an external pressure 50 that acts on control device module 100 from the outside. The pressure compensating device is coupled to the closed housing 10 and to connecting device 2.

If, for example, the first and second internal pressures increase as a result of a change of temperature in housing 10 and in closed space 20A, these pressures are adapted to external pressure 50 by pressure compensating device 30. After the pressure compensation, first and second internal pressures 11, 21 correspond to the external pressure.

Figure 2A:
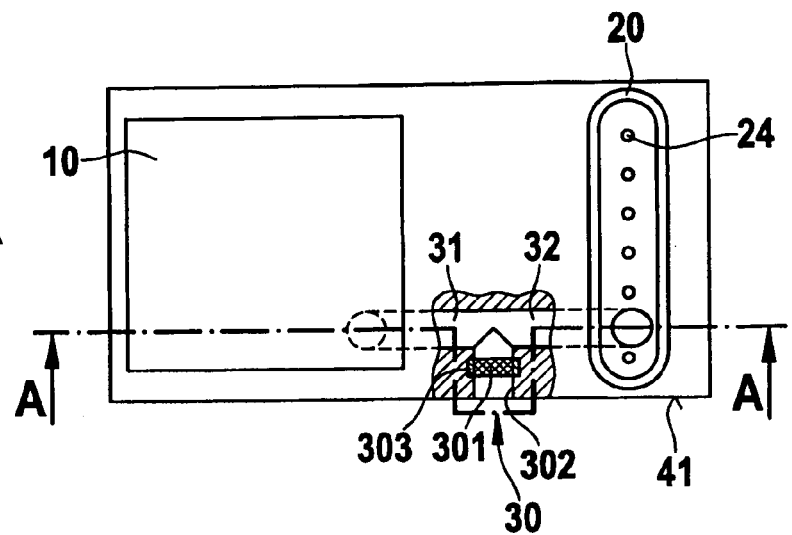
FIG. 2A shows a top view of an exemplary embodiment of the control device module according to the present invention.
Figure 2B:
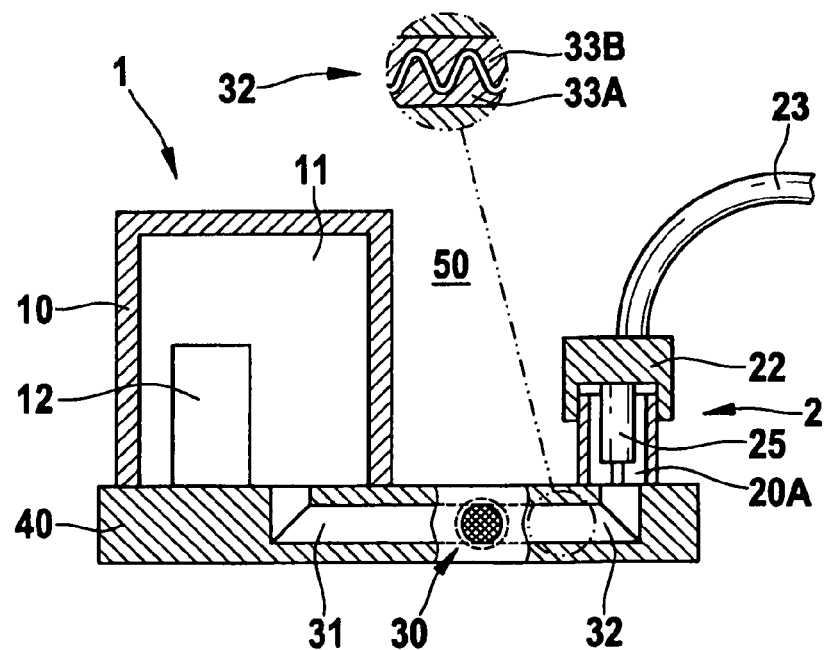
FIG. 2B shows a section through the control device module of the exemplary embodiment from FIG. 2A.

FIGS. 2A and 2B show a top view or, respectively, a section of a detailed exemplary embodiment of a control device module 100 according to the present invention. Control device 1 and connecting device 2 are situated on a bearer 40. Plug socket 20 has contact pins 24. Plug 22 (not shown in FIG. 2A) with contact sleeves 25 creates an electrically conductive contact between the contact pins and cable 23. Cable 23 is a component of a cable harness. With socket 20, plug 22 forms closed space 20A. Space 20A and housing 10 are connected in pressure-conducting fashion to pressure compensating device 30 via gas-conducting ducts 31, 32. Pressure compensating device 30 provides a membrane 301 that is welded in the bearer. Membrane 301 seals a gas-conducting and pressure-conducting duct 302 that connects an external surface 41 of bearer component 40 to pressure-conducting elements 31, 32, which are situated inside bearer component 40. If membrane 301 is not welded into bearer component 40, fastening devices 303 can alternatively be provided, e.g. clips, that hold membrane 301 in position. Pressure elements 31, 32 have a labyrinth seal 33A, 33B.

When the air contained in housing 10 becomes warmer, the first internal pressure 11 increases. This causes an increase in the pressure in pressure-conducting element 31. Thus, internal pressure 11 is applied to membrane 301 at the inside. If internal pressure 11 exceeds external pressure 50, air flows through Gore-Tex membrane 301. Any moisture that may be contained in the air can be transported in this direction through Gore-Tex membrane 301. This results in a reduction of the air moisture in control device 1, as well as to a pressure compensation between internal pressure 11 and external pressure 50. If the temperature in housing 10 decreases, air pressure 11 decreases. This causes a partial vacuum at the inside of membrane 301. As a result, external air flows through the membrane into pressure conducting membrane 31 and then into housing 10. Here, the Gore-Tex membrane prevents the penetration of moisture and particles contained in the external air through duct 302. A pressure compensation between external pressure 50 and internal pressure 11 is thus ensured without the penetration of materials that could have an adverse effect on the functioning of the control device.

During or before installation, or also during maintenance, plug 22 is not plugged into socket 20. As a result, the penetration of dust particles or moisture cannot be prevented. In this case, labyrinth seal 33A, 33B prevents dust particles or liquid from penetrating into control device 1 through pressure-conducting elements 31, 32. In this way, a long life span of control device module 100, as well as its reliable functioning, can be ensured.

Figure 3:
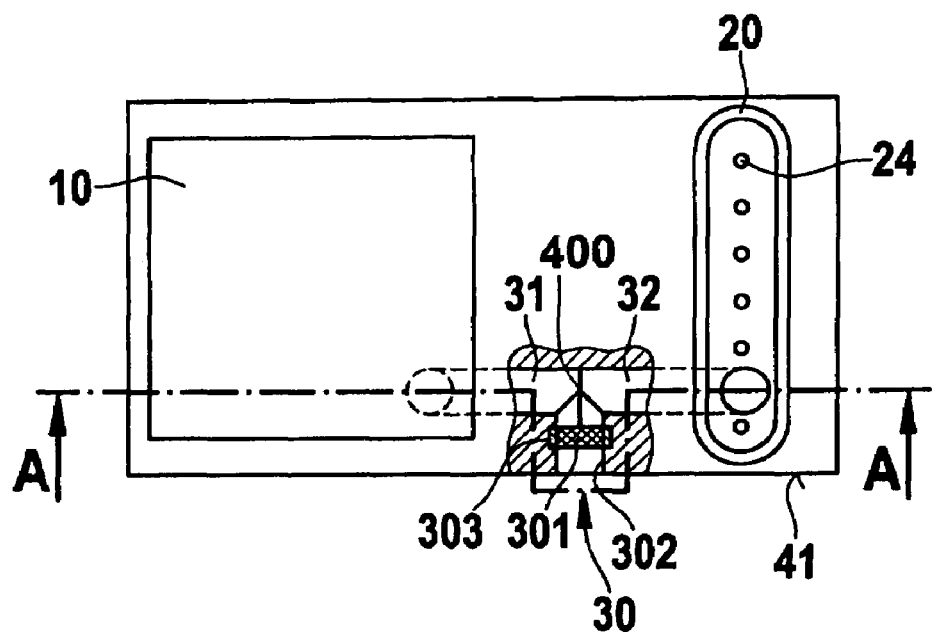
FIG. 3 shows a top view of another exemplary embodiment of the control device module according to the present invention.

In another exemplary embodiment, shown in FIG. 3, it is shown that housing 10 and connecting device 20 are each connected to pressure compensating device 30 by a pressure-conducting element 31, 32, both connecting devices 31, 32 being connected only via pressure compensating device 30. A dividing or separating wall 400 separates the two connecting devices 31, 32 in such a way that no direct connection exists between the two connecting devices 31, 32. Membrane 301 seals connecting device 31 and connecting device 32 separately, in the provided manner.

The present invention is not limited to the specific design of a control device module shown in the Figures.

In an embodiment of the present invention, for example a plurality of connecting devices and/or a plurality of control devices may be present that are all connected to the pressure compensating device for adapting the internal pressures prevailing in the connecting devices and in the control devices to an external pressure. Here, a plurality of pressure-conducting elements can also be provided. In addition, the use of a plurality of membranes is conceivable.

The membrane is preferably situated in such a way that it does not come into contact with liquid.

Alternatively, the plug can be provided so as to be screwed on or hooked on.

Instead of the labyrinth seal, a plurality of other seals are conceivable, such as a lip seal.

What is claimed is:

1. A control device module for a motor vehicle, comprising:
    a control device having a closed housing, wherein a first internal pressure prevails in the closed housing;
    at least one connecting device configured to couple a connecting element of an electrical cable, wherein a closed space is defined by the coupling of the connecting device to the connecting element, and wherein a second internal pressure prevails in the closed space; and
    a pressure compensating device configured to adapt the first and second internal pressures to an external pressure that acts on the control device module from the outside.

2. The device as recited in claim 1, wherein the pressure compensating device has a membrane.

3. The device as recited in claim 2, wherein the membrane is configured to be at least one of impermeable to liquid and permeable to gas.

4. The device as recited in claim 3, wherein the membrane is a microporous membrane configured to conduct vapors from liquids to the outside and not permit liquids to penetrate into the control device module.

5. The device as recited in claim 3, wherein at least one of the housing and the connecting device is connected to the pressure compensating device by at least one pressure-conducting element.

6. The device as recited in claim 5, wherein the housing and the connecting device are connected to the pressure compensating device by two pressure-conducting elements, and wherein both pressure-conducting elements are connected to each other only via the pressure compensating device.

7. The device as recited in claim 5, wherein the at least one pressure-conducting element is configured as a gas-conducting duct.

8. The device as recited in claim 5, wherein the at least one pressure-conducting element has a sealing element configured to prevent a penetration of at least one of liquids and particles into at least one of the control device and the connecting device.

9. The device as recited in claim 8, wherein the sealing element is configured as a labyrinth seal.

10. The device as recited in claim 5, wherein the housing and the connecting device are situated on a bearer component, and wherein the bearer component accommodates at least one of the pressure compensating device and the pressure-conducting element.

11. The device as recited in claim 5, wherein the connecting element has at least one of a plug and a socket configured to couple a cable harness.

12. A control device module for a motor vehicle, comprising:
    a first control device having a closed housing, wherein a first internal pressure prevails in the closed housing;
    a second control device having a closed space, wherein a closed space is defined by a coupling of a connecting device to a connecting element, and wherein a second internal pressure prevails in the closed space;
    a pressure compensating device configured to adapt the first and second internal pressures to an external pressure that acts on the control device module from the outside,
    wherein the closed housing is connected to the pressure compensating device by a first pressure-conducting element and the closed space is connected to the pressure compensating device by a second pressure-conducting element, the first and second pressure-conducting elements being separated by a separating wall.

13. The device as recited in claim 12, wherein a membrane seals each of the pressure-conducting elements separated.

14. The device as recited in claim 13, wherein the membrane is configured to be at least one of impermeable to liquid and permeable to gas.

15. The device as recited in claim 14, wherein the membrane is a microporous membrane configured to conduct vapors from liquids to the outside and not permit liquids to penetrate into the control device modules.

16. The device as recited in claim 13, wherein the pressure-conducting elements are configured as gas-conducting ducts.

17. The device as recited in claim 13, wherein each of the pressure-conducting element have a sealing element configured to prevent a penetration of at least one of liquids and particles into the control devices and the connecting device.

18. The device as recited in claim 17, wherein the sealing element is configured as a labyrinth seal.

19. The device as recited in claim 12, wherein the housing and the connecting device are situated on a bearer component, and wherein the bearer component accommodates at least one of the pressure compensating device and the pressure-conducting elements.

20. The device as recited in claim 5, wherein the connecting element has at least one of a plug and a socket configured to couple a cable harness.

* * * * *